United States Patent
Beaulieu et al.

(10) Patent No.: US 7,696,631 B2
(45) Date of Patent: Apr. 13, 2010

(54) WIRE BONDING PERSONALIZATION AND DISCRETE COMPONENT ATTACHMENT ON WIREBOND PADS

(75) Inventors: Frederic Beaulieu, Shefford (CA); Mukta G. Farooq, Hopewell Junction, NY (US); Kevin S. Petrarca, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 11/953,300

(22) Filed: Dec. 10, 2007

(65) Prior Publication Data

US 2009/0146321 A1    Jun. 11, 2009

(51) Int. Cl.
*H01L 23/49* (2006.01)
*H01L 21/56* (2006.01)

(52) U.S. Cl. ............... 257/784; 257/694; 257/E21.502; 257/E23.024

(58) Field of Classification Search .......... 257/780.781, 257/784, E23.024, E23.025, E23.033, E23.068, 257/E23.141, E21.509; 438/761
See application file for complete search history.

(56) References Cited

U.S. PATENT DOCUMENTS

| 5,954,260 A | 9/1999 | Orcutt |
| 6,155,474 A | 12/2000 | Orcutt |
| 6,181,200 B1 | 1/2001 | Titizian et al. |
| 2004/0026772 A1* | 2/2004 | Schoenfeld ............... 257/691 |
| 2005/0202621 A1 | 9/2005 | Wong et al. |
| 2005/0224964 A1* | 10/2005 | Barber ...................... 257/728 |

* cited by examiner

*Primary Examiner*—Fernando L Toledo
*Assistant Examiner*—Mamadou Diallo
(74) *Attorney, Agent, or Firm*—Scully, Scott, Murphy & Presser, P.C.; Wenjie Li, Esq.

(57) ABSTRACT

Inner wire bond pads are formed within a peripheral region of a semiconductor chip and at least one bonding wire is attached to the inner wire bond pads. The semiconductor chip may be customized for a specific configuration of choice by wiring inner wire bond pads. Alternately, the bonding wires may be employed to reinforce a power network or a ground network. Further, the bonding wire may serve as a passive radio frequency (RF) component. In addition, the bonding wire may be used a heat conduction path to transfer heat from the semiconductor chip to the upper package housing.

20 Claims, 10 Drawing Sheets

WIRE BONDING PERSONALIZATION AND DISCRETE COMPONENT ATTACHMENT ON WIREBOND PADS

FIELD OF THE INVENTION

The present invention generally relates to semiconductor devices, and particularly to structures formed by wire bonding and methods of manufacturing the same.

BACKGROUND OF THE INVENTION

Once fabrication of integrated circuit elements on a semiconductor substrate is completed, the semiconductor substrate is diced and packaged employing a wire bonding process. Typically, the semiconductor chip is manufactured with a passivation layer and package side bond pads, or simply "wire bond pads" on a top surface. The semiconductor chip is subsequently mounted on a chip package employing, for example, an adhesive such as an epoxy. Within the semiconductor chip, integrated circuit elements are electrically connected to the wire bond pads by interconnect structures in back-end-of line (BEOL) metallization levels. The wire bond pads are typically formed out of the last layer of metal among the back-end-of-line (BEOL) metallization levels. The wire bond pads are large enough to accommodate a ball. The wire bond pads provide structures for electrical connection between the fabricated integrated circuit elements and the chip package.

On the outside of the chip package, package pins that comprise a conductive material and arranged in a line or in a two-dimensional array are provided. Each of the package pins is electrically connected through the chip package to a package side bond pad located on the inside of the chip package. Wire bonding refers to the process of making interconnections between the wire bond pads and the package side bond pads so that the chip is electrically wired to the package pins as part of a semiconductor chip manufacturing sequence. Wire bonding is a cost-effective interconnect technology for chip packaging, and is widely practiced in the semiconductor industry.

Figure 1:
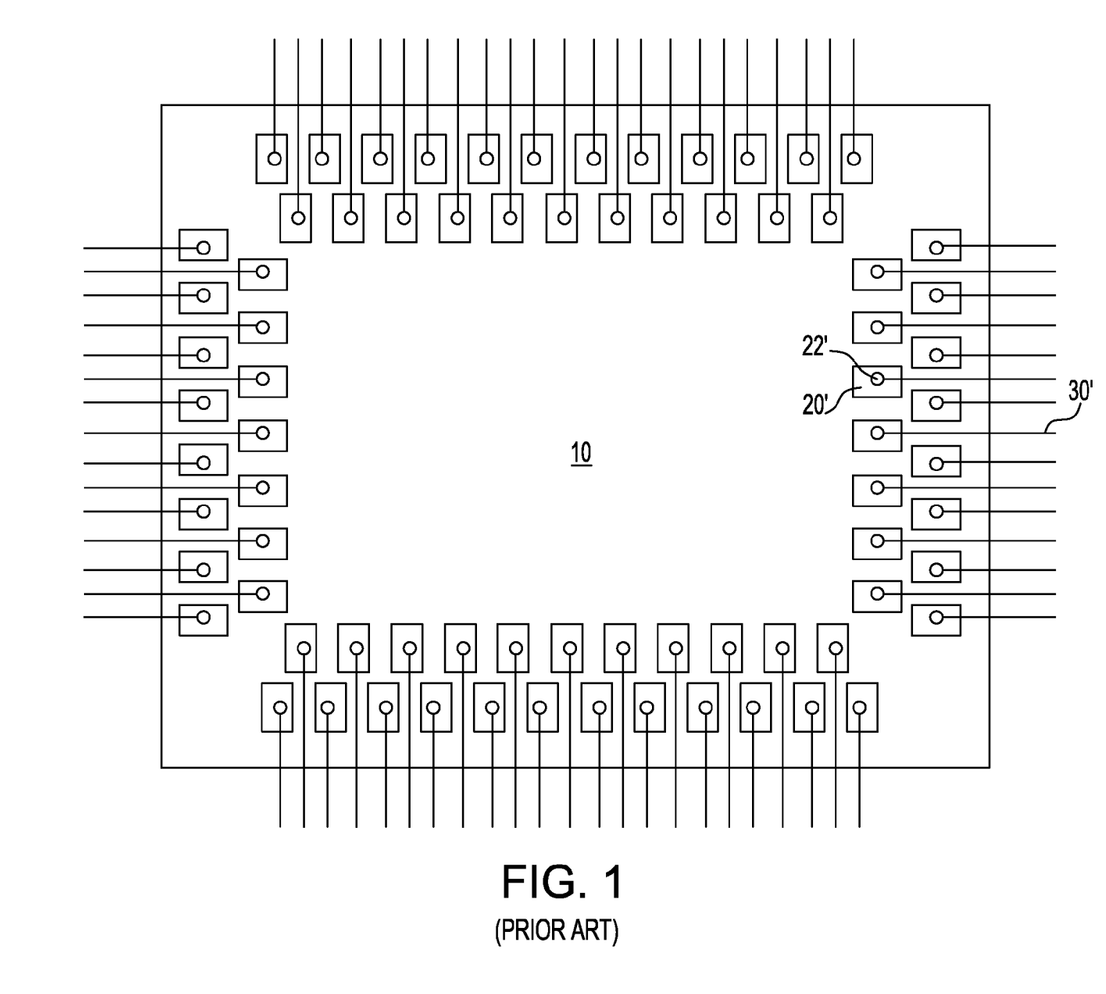
FIG. 1 is a top-down view of an exemplary prior art structure containing a semiconductor chip after a wire bonding process.

Referring to FIG. 1, a top-down view of an exemplary prior art structure shows a semiconductor chip 10 after a wire bonding process. The exemplary prior art structure shows wire bond pads 20' arranged in two rows along the periphery of the semiconductor chip 10. Typically, a bonding wire 30' is connected to each of the wire bond pad 20' via a ball bond 22'. The bonding wires 30' typically comprise gold. The diameter of the bonding wires are from about 15 micron to several hundreds of microns. A wire bonding process employing a ball bond 22' is called "ball bonding." The bonding wires 30' are welded to the ball bond 22' by a combination of heat, pressure, and/or ultrasonic energy.

Figure 2:
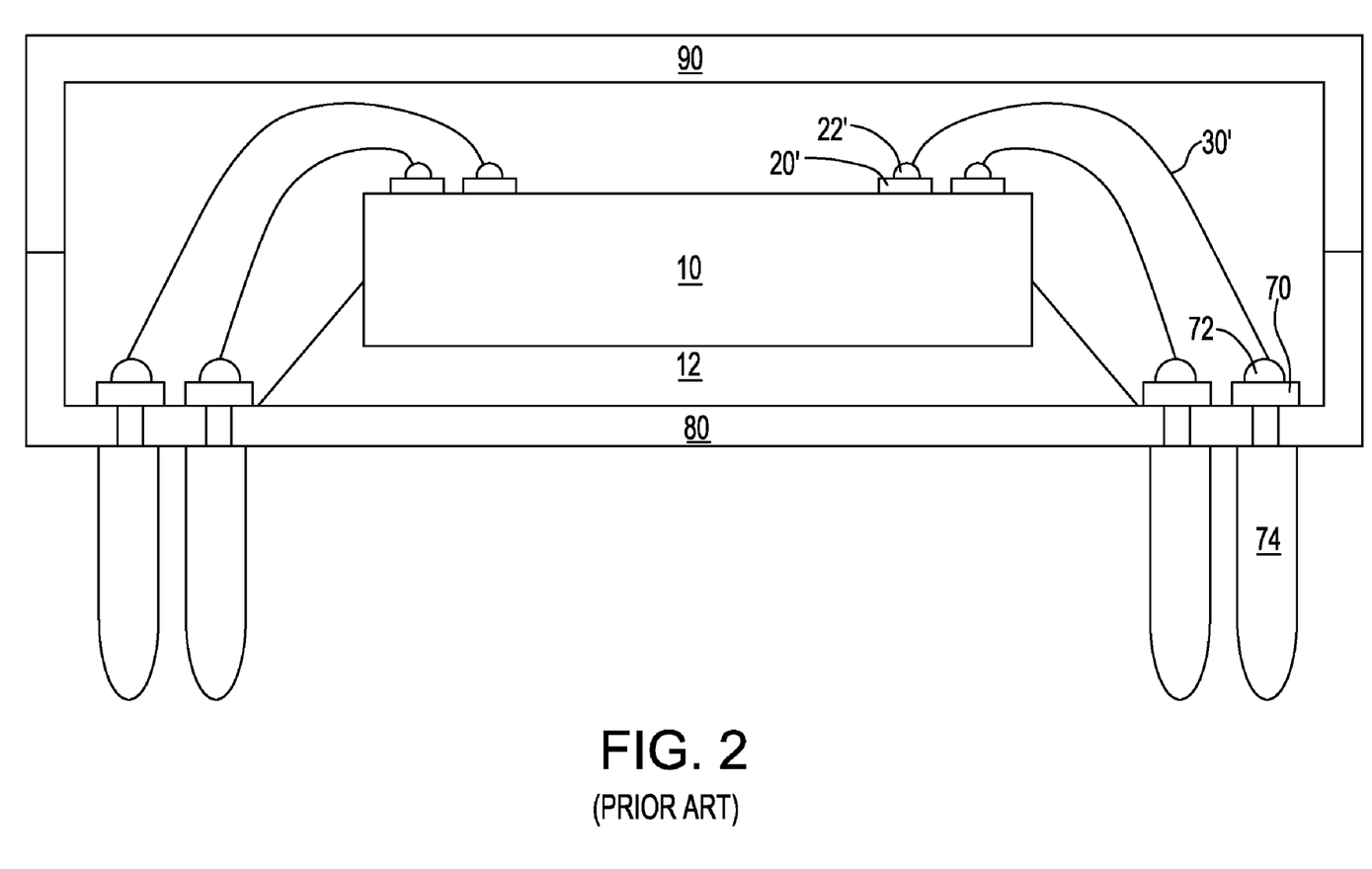
FIG. 2 is a vertical cross-sectional view of another exemplary prior art structure containing a semiconductor chip after a wire bonding process.

Referring to FIG. 2, a vertical cross-sectional view of another exemplary prior art structure comprises a semiconductor chip 10 mounted on a lower package housing 80 by an adhesive layer 12, which may comprise an epoxy. Package side bond pads 70 are located on the inside of the lower package housing 80, and package pins 74 are located on the outside of the lower package housing 80. Each of the package pins 74 is connected to one of the package side bond pads 70 through the lower package housing 80. One end of each of the bonding wires 30' is connected to one of the wire bond pads 20' through one of the ball bonds 22' as described above. The other end of each of the bonding wires 30' is connected to one of the package side bond pads 70 through a wedge bond 72, which tends to be larger than a ball bond 22'. The wire bonding process employing a wedge bond 72 is called "wedge bonding." The bonding wires 30 are welded to the wedge bond 72 by a combination of heat, pressure, and/or ultrasonic energy as in ball bonding. An upper package housing 90 and the lower package housing 80 encapsulates the semiconductor chip 10 to provide protection from ambient environment and prevents oxidation or moisture ingress into the semiconductor chip 10. The chip package comprises the upper package housing 90, the lower package housing 80, the package side bond pads 70, and the package pins 74.

Many semiconductor chips have similar functionality that may be accommodated by substantially the same category of devices or circuits but require different wiring in the last interconnect level. In some other cases, a redundancy mechanism in the semiconductor chip or different portions of the semiconductor chip may be activated by altering a wiring in the last interconnect level.

In view of the above, there exists a need for capability to alter configurations of a semiconductor chip after normal manufacturing process.

While many versatile functions are provided by a semiconductor chip, the functions are limited by limitations imposed by manufacturing process. One example of such limitation is power supply network wiring in top metal wiring levels. The height of metal wires in any back-end-of-line is limited by the height of the metal line trench formed in a dielectric layer, which is typically less than 4 microns even for tallest metal lines. Further, the width of the metal wires is limited as well due to requirement for planarization. Patterning of an exposed layer of metal, while capable of providing a metal line hundreds of microns wide, tends to generate byproducts that cause contamination of the surface of the chip.

Consequently, there exists a need for a structure that may provide low resistance conduction paths for a power supply network at the top level of a semiconductor chip interconnect structures without contaminating a top surface of the semiconductor chip or with enhanced robustness in the power supply network.

Further, many radio frequency (RF) components require a large conductive structure. For example, an antenna or an inductor in a chip employing RF components may require a conductive wire on a millimeter scale. In the prior art, such structure are formed within BEOL interconnect levels, occupies a large volume, and hinders wiring of the chip as well as limited performance.

Therefore, there exists a need for alternate structures that may provide the functions of RF components without occupying much volume in BEOL interconnect levels. Furthermore, there exists a need to improve performance of RF components by lowering resistance of the RF components.

In addition, semiconductor chips generate a significant amount of heat, which tends to degrades performance of semiconductor devices, for example, by reduction of on-current, increase in resistance, etc.

Hence, there exists a need to enhance efficiency of heat transfer from a semiconductor chip to a chip package.

SUMMARY OF THE INVENTION

The present invention addresses the needs described above by providing structures in which inner wire bond pads are formed within a peripheral region of a semiconductor chip and a bonding wire is attached to at least one of the additional bond pads.

The inner wire bond pads are connected to programmable nodes of a circuitry located in the semiconductor chip having multiple potential configurations. By selectively connecting some of the inner wire bond pads, one of potential configurations of the semiconductor chip is specified during the wire bonding process. Thus, the semiconductor chip may be customized, or "personalized" for a specific configuration of choice. Alternately, the inner wire bond pads may be connected to power supply nodes and/or ground nodes and bonding wires may be employed as an uppermost level power distribution network wiring or an uppermost level ground network wiring to advantageously provide a robust power grid and/or a ground grid having low resistance, and consequently, low voltage drop across the semiconductor chip.

Also, a bonding wire connected to at least one inner wire bond pad may serve as a passive radio frequency (RF) component such as an antenna or an inductor, providing a high quality, low resistance RF component to the semiconductor chip.

Further, one end of the bonding wire may be wire bonded to an inner wire bond pad and the other end may extend upward to touch an upper package housing. The bonding wire provides a heat conduction path to transfer heat from the semiconductor chip to the upper package housing.

The bonding wire may be confined inside the peripheral region and does not extend over the peripheral region. In case the bonding wire is employed to provide heat conduction, the bonding wire may extend over the peripheral region without touching the outer wire bond pads.

According to an aspect of the present invention, a semiconductor structure is provided, which comprises:
a semiconductor chip;
at least one outer bond pad located in a peripheral region of a top surface of the semiconductor chip;
at least one inner bond pad located on the top surface inside the peripheral region of the semiconductor chip; and
at least one bonding wire, extending from the at least one inner bond pad, disjoined from the at least one outer bond pad, and not extending over the peripheral region.

In one embodiment, the semiconductor structure further comprises at least two programmable nodes that alter functionality of the semiconductor chip by presence or absence of an electrical contact between one of the at least two programmable nodes to another of the at least two programmable nodes and located in the semiconductor chip; wherein the at least one inner bond pad includes at least two inner bond pads, wherein each of the at least two programmable nodes is connected to the at least two inner bond pads, and wherein the at least one bonding wire connects two of the at least two inner bond pads.

The semiconductor structure may further comprise:
a chip package containing at least one package side bond pad; and
at least another bonding wire connecting one of the at least one outer bond pad and one of the at least one package side bond pad.

The at least two inner bond pads and the at least one outer bond pad may comprise the same material and may be located on a top surface of the semiconductor chip.

The semiconductor structure may further comprise ball bonds located directly on the at least two inner bond pads and directly adjoined to the at least one bonding wire, wherein the bonding wire is a gold wire having a diameter from about 15 microns to about 500 microns.

In another embodiment, the at least one inner bond pad includes at least two inner bond pads, and wherein the at least one bonding wire connects two of the at least two inner bond pads.

The semiconductor structure may further comprise at least one of a power supply network and a ground network located in the semiconductor chip, wherein the at least one bonding wire provides an electrical connection between two nodes of the power supply network or between two nodes of the ground network.

The at least one bonding wire may be a passive component that passively alters operation of at least one semiconductor device in the semiconductor chip. The passive component is one of an antenna, an inductor, and a coil.

In yet another embodiment, the at least one bonding wire may be disjoined from the at least one outer bond pad and any other of the at least one inner bond pad.

The at least one bonding wire may be a passive component that passively alters operation of at least one semiconductor device in the semiconductor chip. The passive component is one of an antenna, an inductor, and a coil.

The semiconductor structure may further comprise a chip package that encapsulates the semiconductor chip, wherein the at least one bonding wire contacts an inner surface of the chip package and transfers heat from the semiconductor chip the chip package.

According to still another aspect of the present invention, a method of forming a semiconductor structure is provided, which comprises:
forming at least one outer bond pad in a peripheral region of a top surface of a semiconductor chip and at least one inner bond pad on the top surface inside the peripheral region;
drawing at least one bonding wire from the at least one outer bond pad; and
drawing at least another bonding wire from the at least one inner bond pad, wherein the at least one bond wire does not extend over the peripheral region, i.e., the at least one bond wire is confined within the peripheral region.

In one embodiment, the method further comprises forming a ball bond on each of the at least one outer bond pad, wherein the ball bond directly contacts the at least one outer bond pad and the at least one bonding wire.

In another embodiment, the at least one outer bond pad and the at least one inner bond pad comprise gold and the at least one bonding wire comprises about 99% of gold and about 1% of silicon.

In even another embodiment, the at least one inner bond pad comprises at least two inner bond pads, and the method further comprises:
forming at least two programmable nodes that alter functionality of the semiconductor chip by presence or absence of an electrical contact between one of the at least two programmable nodes to another of the at least two programmable nodes in the semiconductor chip, wherein each of the at least two programmable nodes is connected to the at least two inner bond pads; and
connecting one of at least two inner bond pads to another of at least two inner bond pads via the at least one bonding wire.

In yet another embodiment, the at least one inner bond pad comprises at least two inner bond pads, and the method further comprises:
forming at least one of a power supply network and a ground network in the semiconductor chip;
connecting one of at least two inner bond pads to another of at least two inner bond pads via the at least one bonding wire, wherein the at least one bonding wire provides an electrical connection between two nodes of the power supply network or between two nodes of the ground network.

In still another embodiment, the at least one bonding wire is a passive component that passively alters operation of at least one semiconductor device in the semiconductor chip.

In still yet another embodiment, the passive component is one of an antenna, an inductor, and a coil.

In a further embodiment, the method further comprises forming a chip package encapsulating the semiconductor chip, wherein the at least one bonding wire contacts an inner surface of the chip package and transfers heat from the semiconductor chip the chip package.

In an even further embodiment, the method further comprises:
attaching the semiconductor chip to a chip package containing at least one package side bond pad; and
forming at least another bonding wire connecting one of the at least one outer bond pad and one of the at least one package side bond pad.

DETAILED DESCRIPTION OF THE INVENTION

As stated above, the present invention relates to structures formed by wire bonding and methods of manufacturing the same, which are now described in detail with accompanying figures. It is noted that like and corresponding elements are referred to by like reference numerals.

Figure 3:
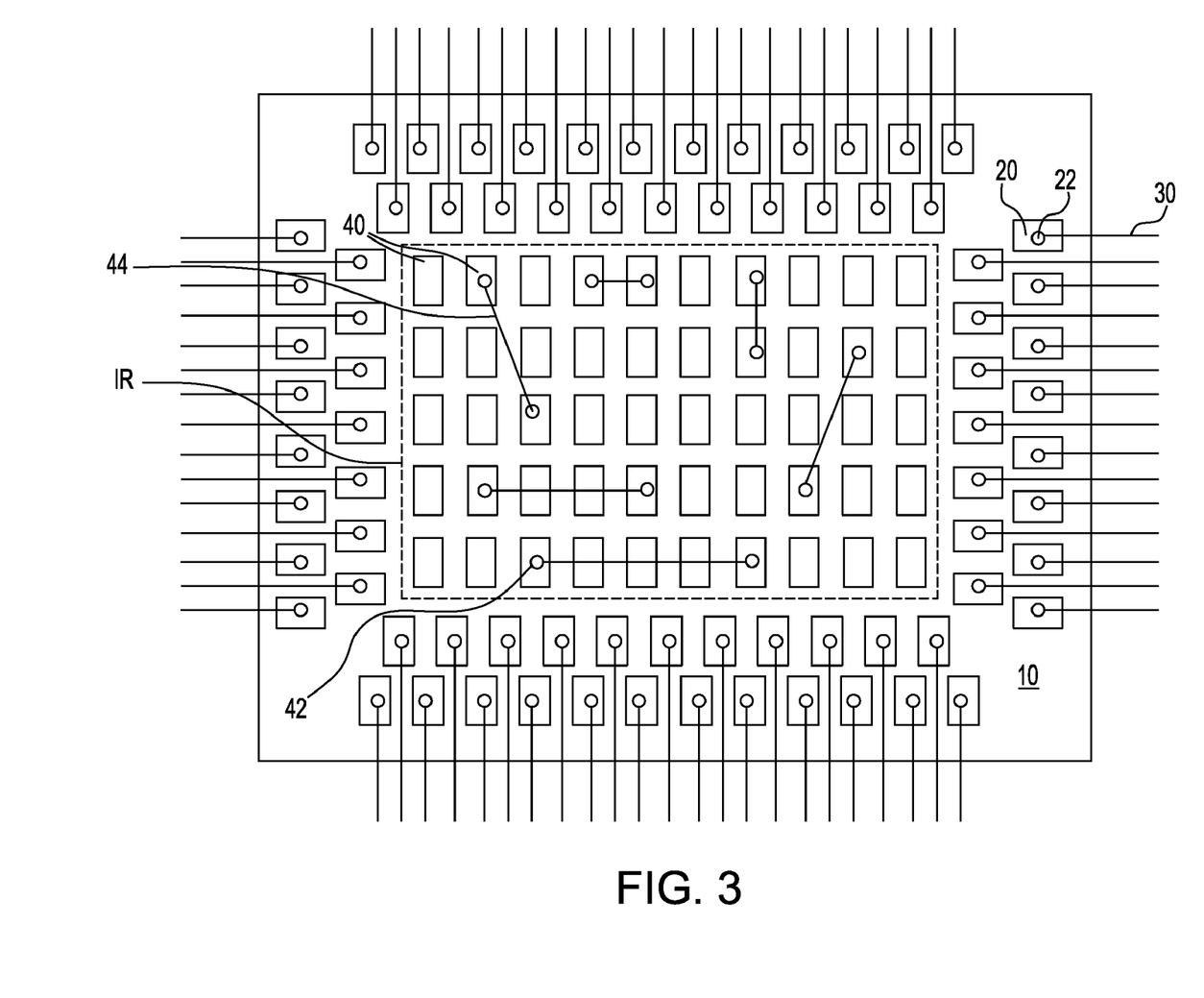
FIGS. 3, 5, 7, and 9 are top down views of a set of exemplary structures containing a semiconductor chip, bond pads, and bonding wires thereupon according to first through fourth embodiments of the present invention, respectively.
Figure 4:
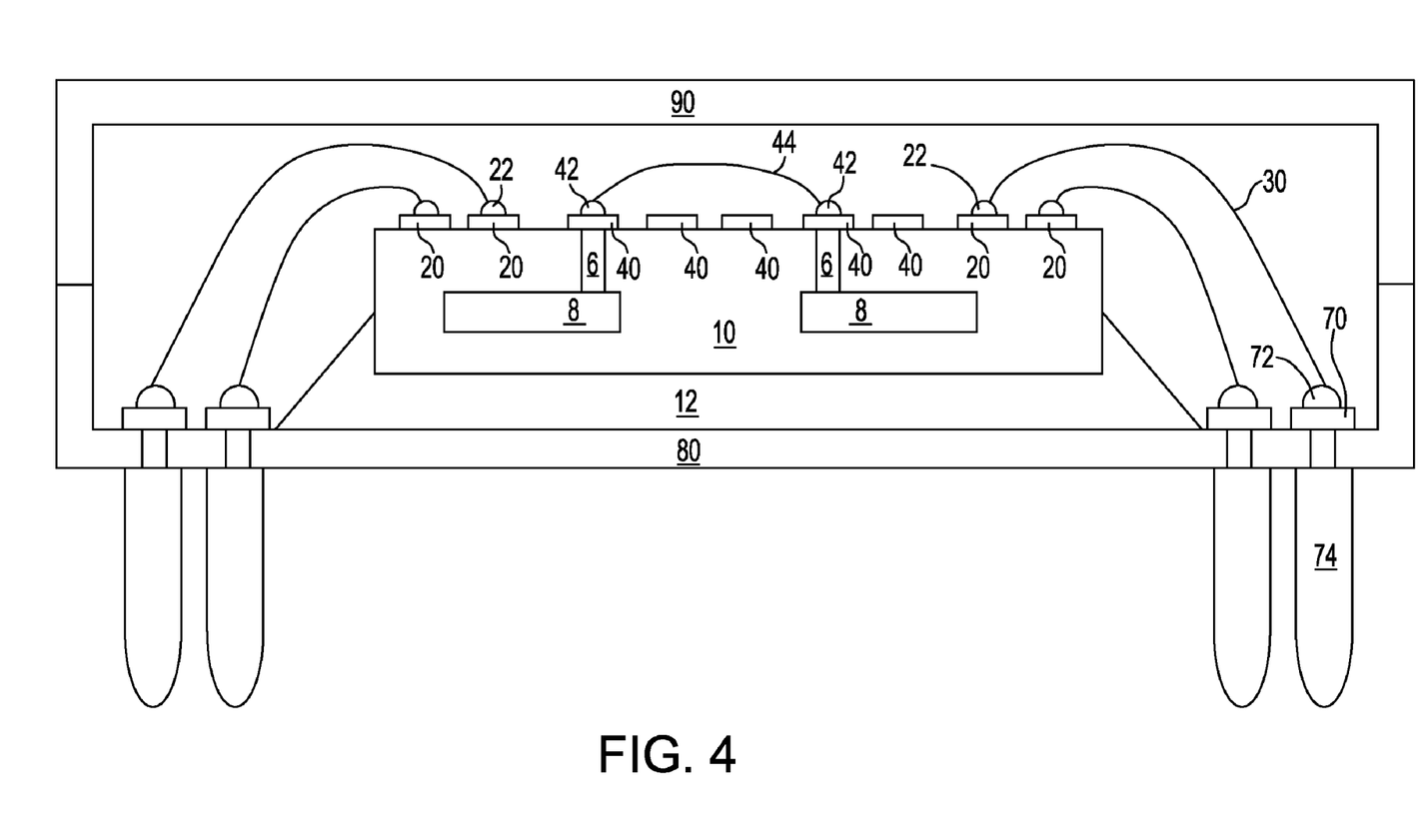
FIGS. 4, 6, 8, and 10 are vertical cross-sectional views of another set of exemplary structures according to the first through fourth embodiments of the present invention, respectively.

Referring to FIGS. 3 and 4, two exemplary semiconductor structures according to a first embodiment of the present invention are shown in a top-down view and in a vertical cross-sectional view, respectively. Both exemplary semiconductor structures comprise a semiconductor chip 10 on which at least one outer bond pad 20 is located in a peripheral region between the outer edges of the semiconductor chip 10 and the area of a dotted rectangle containing an inner region IR of the semiconductor chip 10. The at least one outer bond pad 20 is located on a top surface of the semiconductor chip 10. At least two inner bond pads 40 are located on the top surface of the semiconductor chip within the inner region IR. The at least one bond pad 20 and the at least two inner bond pads 40 are formed in the same processing step by patterning a last metal layer as known in the art, i.e., employing the same processing steps as for formation of the wire bond pads 20' in the prior art structures described above. The at least two inner bond pads 40 may be substantially of the same size as, or have a different size than, the at least one outer bond pad 20. The at least two inner bond pads 40 may be arranged in a linear array or in a two-dimensional array.

The semiconductor chip 10 is mounted on a lower package housing 80 employing an adhesive layer 12. The inside of the lower package housing 80 is provided with at least one package side bond pad 70 each of which is electrically connected to one of at least one package pin 74 on the outside of the lower package housing 80.

In a first application, the semiconductor chip 10 contains at least two programmable nodes 6 (See FIG. 4) that may alter functionality of the semiconductor chip 10 by presence or absence of an electrical contact between one of the at least two programmable nodes 6 to another of the at least two programmable nodes 6. One end of each of the at least two programmable nodes 6 is connected to one of semiconductor devices 8 in the semiconductor chip 10. The semiconductor devices 8 may be a discrete device such as a transistor, a diode, or a passive component, or may be an array of devices such as a static random access memory (SRAM) array or an embedded dynamic random access memory (eDRAM), or may be a processor core. The other end of each of the at least two programmable nodes 6 is connected to one of the at least two inner bond pads 40. The semiconductor devices 8 may be activated or deactivated upon connection of the programmable node 6 attached thereto to another of the at least two programmable nodes 6.

Electrical connection between a pair of the at least two inner bond pads 40 is effected by forming a ball bond 42 on one of the at least two inner bond pads 40 and drawing a first type bonding wire 44 therefrom upward and aside, and then downward to another of the at least two inner bond pads 40 and forming another ball bond 42 thereupon. Thus, ball bonds 42 are formed on both ends of the first type bonding wire 44. Methods of forming ball bonds 42 are known in the art. Each of the ball bonds 42 provide contact between the first type bonding wire 44 and each of the pair of the at least two inner bond pads 40. At least one first type bonding wire 44 is employed to form electrical connections between at least one pair of the at least two inner bond pads 40.

Another ball bond 22 is formed on each of the at least one outer bond pad 20 and another bonding wire 24 is drawn from the another ball bond 22 upward and aside, and then downward to one of the at least one package side bond pad 70. A wedge bond 72 is formed on the end of the another bonding wire 24 and welded to one of the at least one package side bond pad 70. Methods of forming the wedge bond 72 are known in the art. Wire bonding of the at least one outer bond pad 20 and the at least one package side bond pad 70 is the same as conventional wire bonding known in the art.

Typically, the at least one outer bond pad 20 and the at least one inner bond pad 40 comprise gold or other material conducive to wire bonding, which may be formed, for example, by electroplating or electroless plating. The at least one first type bonding wire 44 typically comprises about 99% of gold and about 1% of silicon.

The electrical connection among the at least two inner bonds pads 40 is programmable, and may be changed as needed to customize, or personalize the semiconductor chip 10 to provide different functionality to the semiconductor chip 10 and/or invoke different redundancy components in the semiconductor chip 10. Since the programmable electrical connection is made with the at least one first type bonding wire 44, personalizing of the semiconductor chip by wire bonding does not require any mask level or an associated turn-around time period for manufacture of a mask, but may be instantaneously customized by altering connection schemes among the at least two programmable nodes 6. Thus, the present invention provides a semiconductor chip personalization method without employing an additional mask by tailoring interconnection among the at least two programmable nodes 6 with customized wire bonding among the at least two inner bond pads 40.

In a second application, the semiconductor chip 10 may contain at least one of a power supply network and a ground network. The power supply network or the ground network comprises at least two nodes (not shown) that are connected to the at least two inner bond pads 40 in the same manner as the at least two programmable nodes 6. At least one first type bonding wire 44 provides an electrical connection between the at least two nodes of the power supply network or the ground network.

The physical connection of the at least one first type bonding wire 44 among the at least two nodes of the power supply network or the ground network, as it appears above the top surface of the of the semiconductor chip 10, has the same features as the connection of the at least one first type bonding wire 44 among the at least two programmable nodes 6. The difference is in the circuit within the semiconductor chip such that in the case of the first application, functionality of the semiconductor devices 8 attached to the at least two programmable nodes 6 may be altered by wire bonding to the at least two inner bond pads 40, while in the case of the second application, wire bonding to the at least two inner bond pads 40 provides a new electrical connection between, or reinforces an existing electrical connection between, at least two nodes of the power supply network or the ground network. Since the at least one first type bonding wire 44 has good electrical conductivity and has a large cross-sectional area corresponding to the large diameter of the bonding wires from about 15 micron to about 500 microns, the electrical connection between the two nodes is a solid connection with a very low resistance therebetween.

The at least one first type bonding wire 44 may be formed at the same time as, prior to, or after, formation of the at least another bonding wires 30. Preferably, the at least one first type bonding wire 44 may be formed at the same time as the formation of the at least another bonding wire 30. After the at least one first type bonding wire 44 and the at least another bonding wire 30 are formed, an upper package housing 90 is attached to the lower package housing 80 to encapsulate the semiconductor chip 10 and to provide a hermetic seal from the ambient to prevent adverse environmental effects on the semiconductor chip 10 such as oxidation or moisture ingress.

Figure 5:
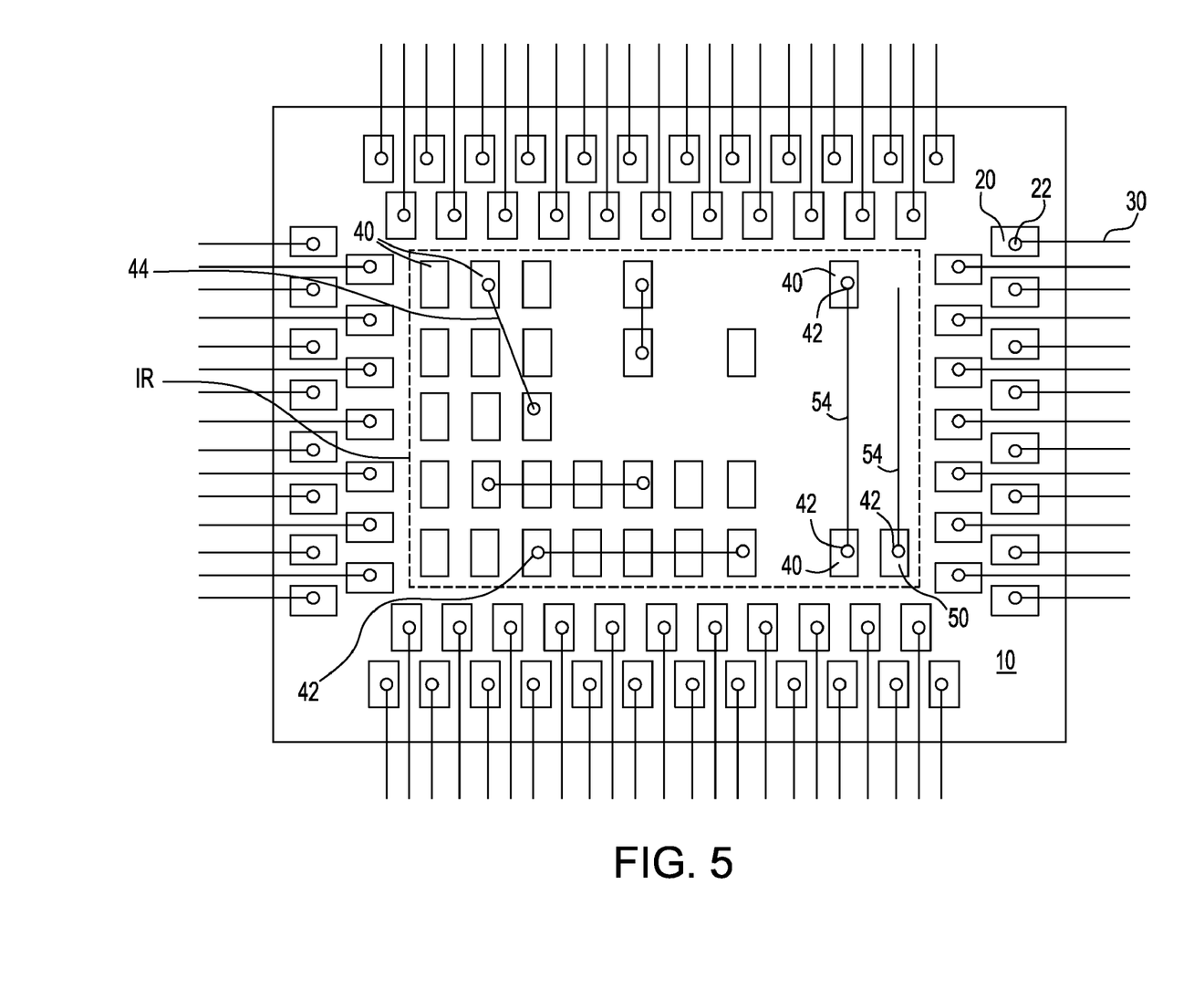
Figure 6:
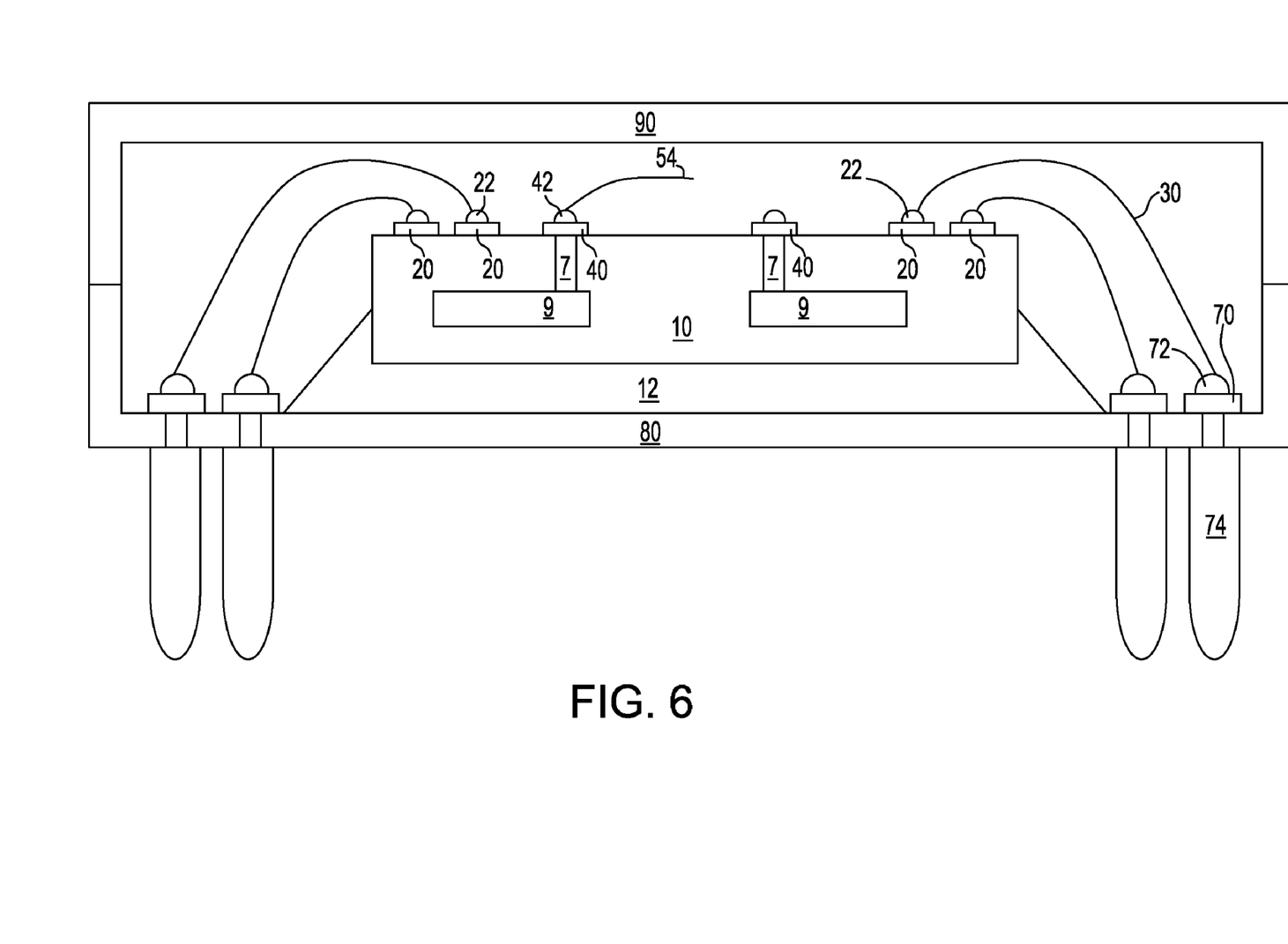

Referring to FIGS. 5 and 6, two exemplary semiconductor structures according to a second embodiment of the present invention are shown in a top-down view and in a vertical cross-sectional view, respectively. Both exemplary semiconductor structures comprise a semiconductor chip 10 and at least one outer bond pad 20 as in the first embodiment. At least one inner bond pad 40 is formed on a top surface of the semiconductor chip 10 in an inner region IR inside a peripheral region. Further, the semiconductor chip 10 is mounted on a lower package housing 80 employing an adhesive layer 12 as in the first embodiment. At least one first type bonding wire 44 connecting a pair of and/or at least another bonding wire 24 may be formed as in the first embodiment.

A ball bond 42 is formed on one of the at least one inner bond pad 40 and a second type bonding wire 54 is drawn therefrom upward and aside. The composition and diameter of the second type bonding wire 54 may be the same as the composition and diameter of the first type bonding wire 44 in the first embodiment. In one case, the second type bonding wire 54 is terminated midair without contacting any of the at least one outer bond pad 20 and any other of said at least one inner bond pad 40. The second type bonding wire 54 may be drawn in a substantially straight line to form an antenna, or may be drawn in a spiral to form a coil or an inductor. The second type bonding wire 54 constitutes a passive component, which is attached to a semiconductor device 9 through a back-end-of-line (BEOL) interconnect structure 7.

In another case, the at least one inner bond pad 40 may comprise at least two inner bond pads 40, and the second type bonding wire 54 may further be drawn downward to another of the at least two inner bond pads 40 to form another ball bond 42 thereupon. Thus, ball bonds 42 are formed on both ends of the second type bonding wire 54. Each of the ball bonds 42 provide contact between the second type bonding wire 54 and each of the pair of the at least two inner bond pads 40. The second type bonding wire 54 may be drawn in a substantially straight line to form an antenna, or may be drawn in a spiral to form a coil or an inductor. The second type bonding wire 54 constitutes a passive component, which is attached to at least one semiconductor device 9 through at least one back-end-of-line (BEOL) interconnect structure 7.

After at least one second type bonding wire 54 and at least another bonding wire 30 between the at least one outer bond pad 20 and at least one package side bond pad 70 are formed, an upper package housing 90 is attached to the lower package housing 80 to encapsulate the semiconductor chip 10 as in the first embodiment.

Figure 7:
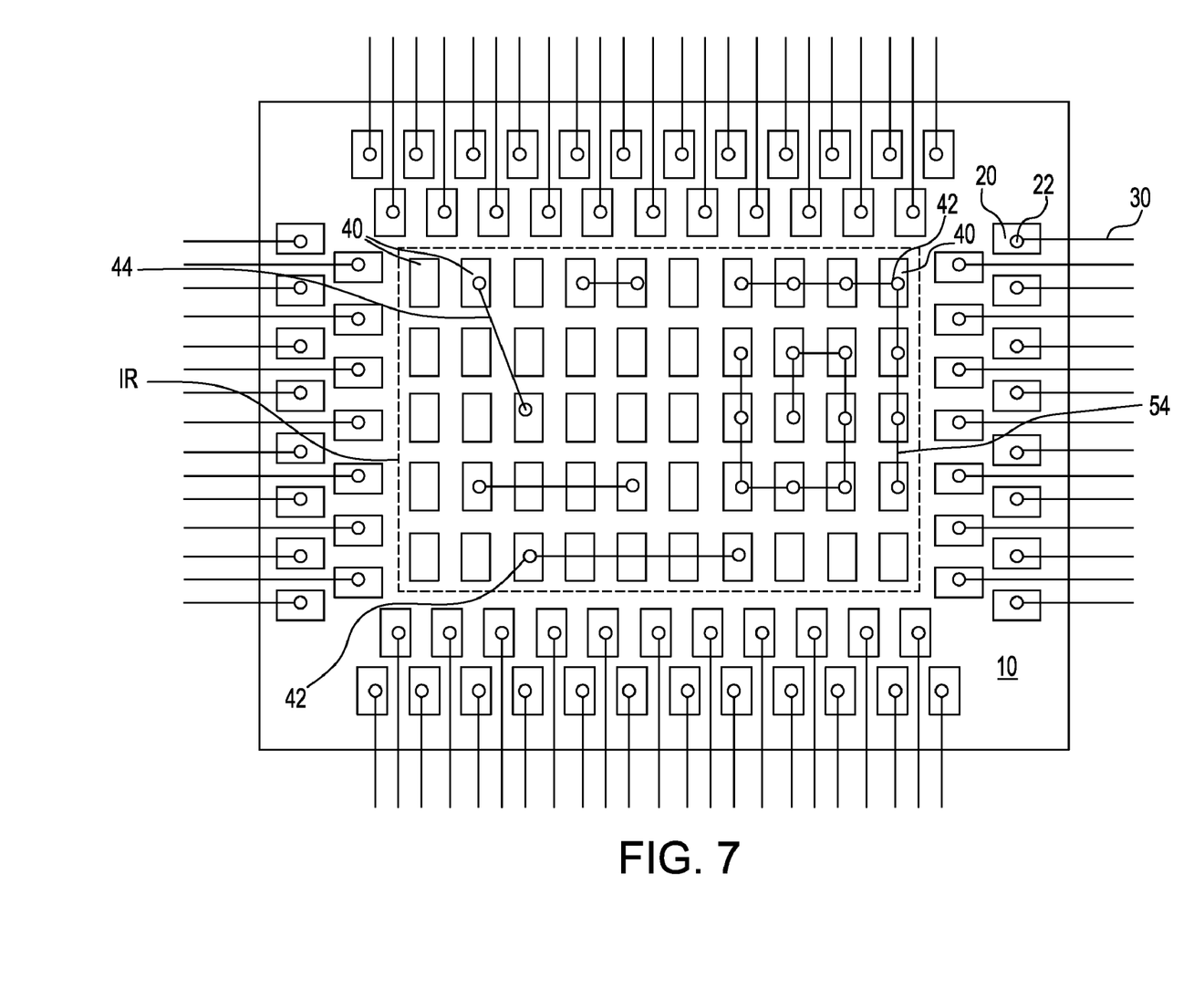
Figure 8:
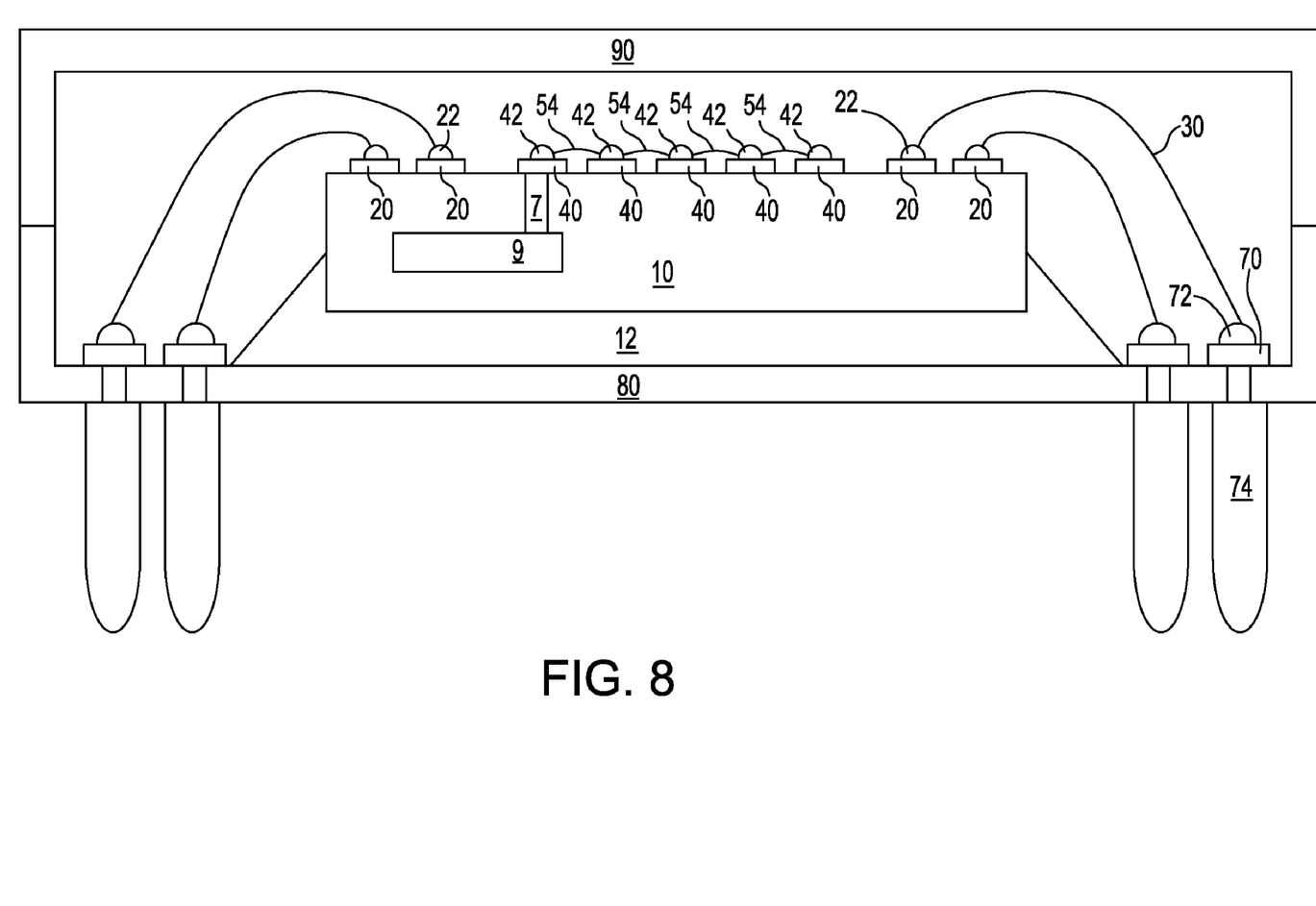

Referring to FIGS. 7 and 8, two exemplary semiconductor structures according to a third embodiment of the present invention are shown in a top-down view and in a vertical cross-sectional view, respectively. Both exemplary semiconductor structures comprise a semiconductor chip 10 and at least one outer bond pad 20 as in the first embodiment. A plurality of inner bond pads 40 is formed on a top surface of the semiconductor chip 10 in an inner region IR inside a peripheral region. Further, the semiconductor chip 10 is mounted on a lower package housing 80 employing an adhesive layer 12 as in the first embodiment. At least one first type bonding wire 44 connecting a pair of and/or at least another bonding wire 24 may be formed as in the first embodiment.

The plurality of inner bond pads 40 is interconnected by at least one second type bonding wire 54. Specifically, a ball bond 42 is formed on one of the plurality of inner bond pads 40. A second type bonding wire 54 is drawn from the ball bond upon the inner bond pad 40 upward and aside, and then downward to another of the plurality of inner bond pads 40 to form another ball bond 42 thereupon. This process may continue to yet another of the plurality of the inner bond pads 40 until a network of second type bonding wires 54 form a passive component constructed over the plurality of the inner bond pads 40. The passive component may be one of an antenna, an inductor, etc. The second type bonding wire 54 may be attached to at least one semiconductor device 9 through at least one back-end-of-line (BEOL) interconnect structure 7.

After the network of second type bonding wires 54 and at least another bonding wire 30 between the at least one outer bond pad 20 and at least one package side bond pad 70 are formed, an upper package housing 90 is attached to the lower package housing 80 to encapsulate the semiconductor chip 10 as in the first embodiment.

Referring to FIGS. 7 and 8, two exemplary semiconductor structures according to a fourth embodiment of the present invention are shown in a top-down view and in a vertical cross-sectional view, respectively. Both exemplary semiconductor structures comprise a semiconductor chip 10 and at least one outer bond pad 20 as in the first embodiment. At least one inner bond pad 40 is formed on a top surface of the semiconductor chip 10 in an inner region IR inside a peripheral region. Further, the semiconductor chip 10 is mounted on a lower package housing 80 employing an adhesive layer 12 as in the first embodiment. At least one first type bonding wire 44 connecting a pair of and/or at least another bonding wire 24 may be formed as in the first embodiment.

Figure 9:
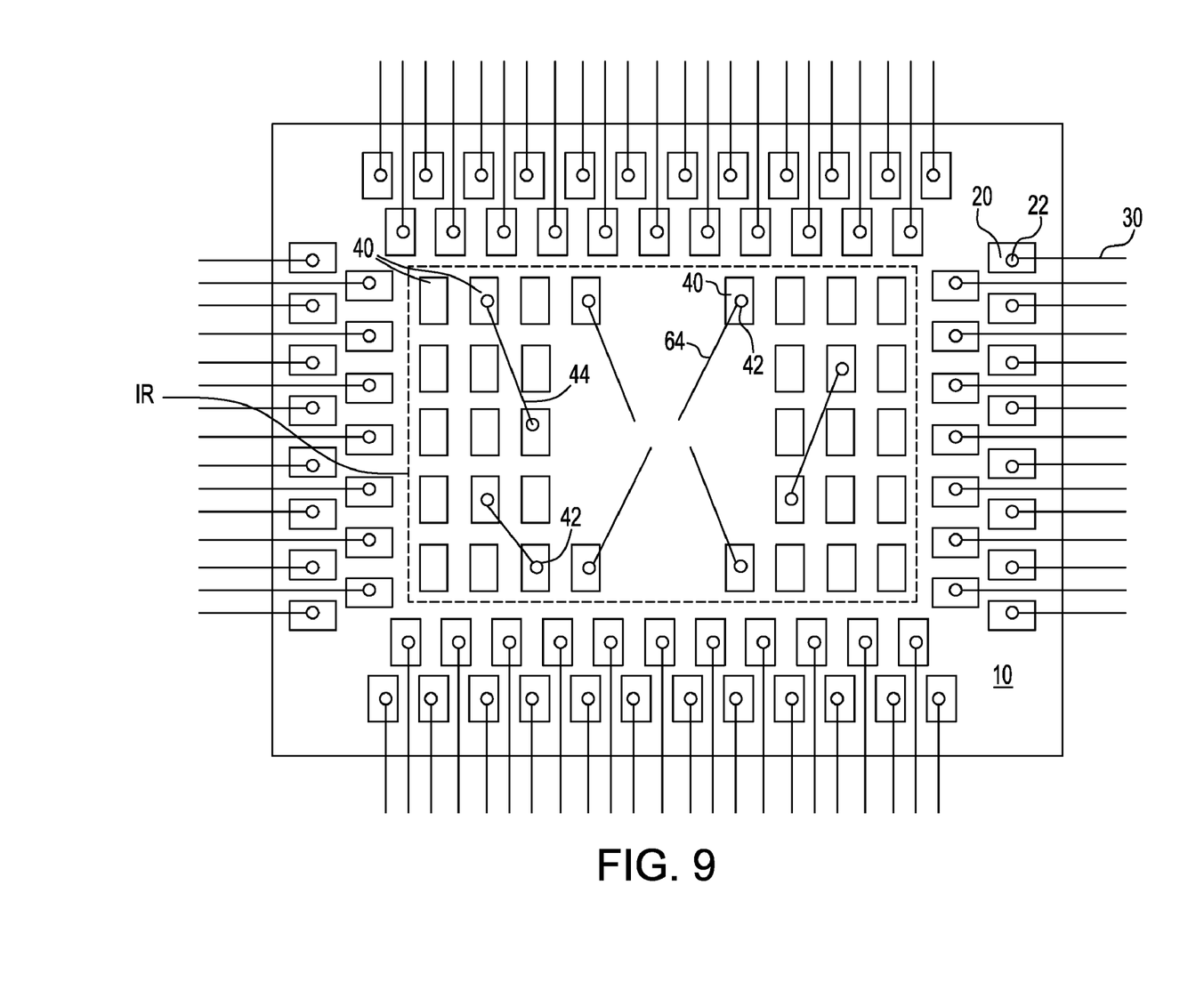
Figure 10:
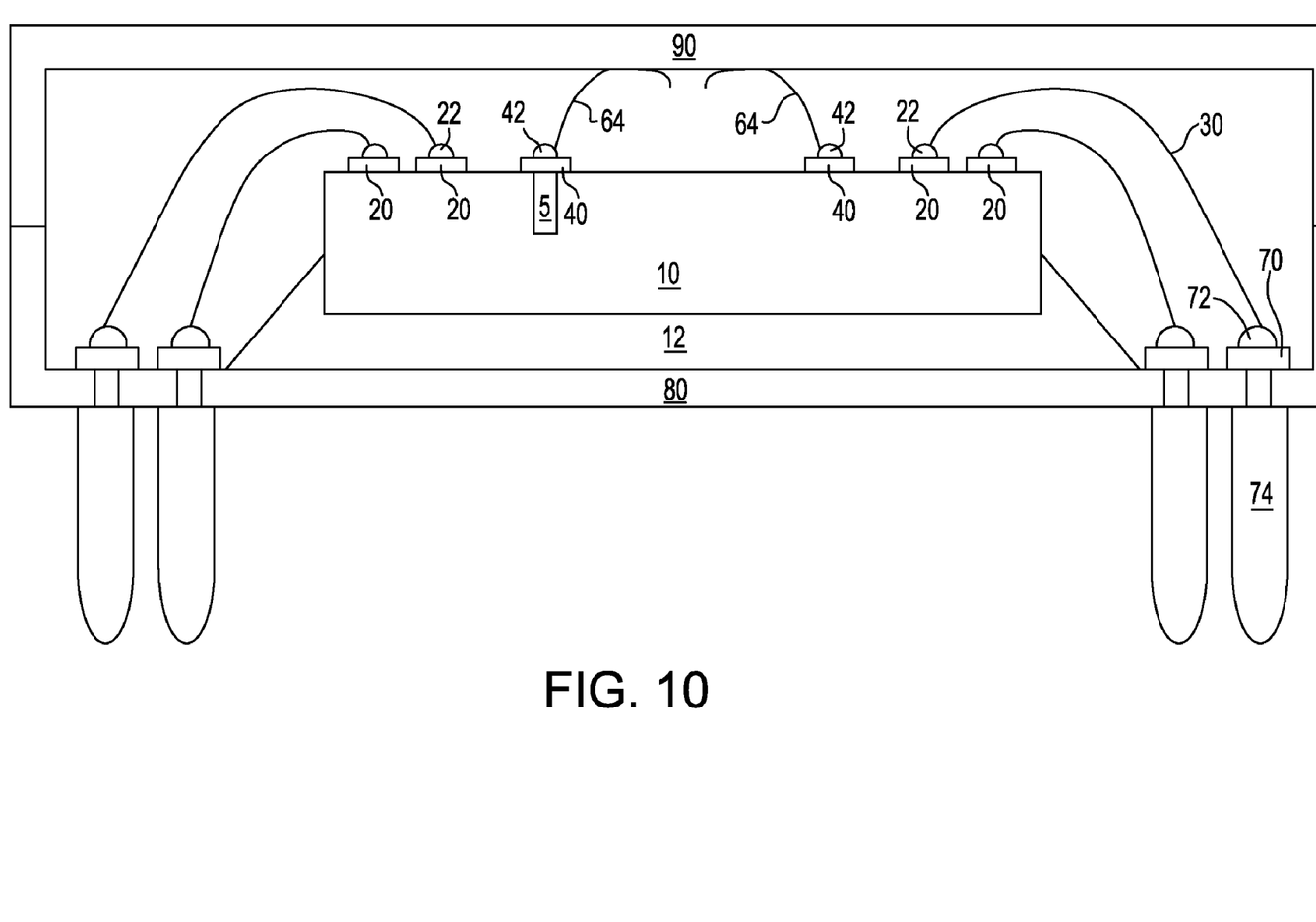

The at least one inner bond pad 40 may, or may not, be interconnected to a semiconductor device in the semiconductor chip 10. An interconnect structure 5 may be connected to the at least one inner bond pad 40. In case the at least one inner bond pad 40 is connected to the semiconductor device through the interconnect structure 5, the portion of the semiconductor device to which the interconnect structure 5 is connected to is electrically grounded. Alternatively, the at least one inner bond pad 40 may be electrically floating. Preferably, the at least one inner bond pad 40 is thermally connected to a heat generating portion of the semiconductor chip 10, such as a processor core, by the interconnect structure 5 so that the interconnect structure 5 efficiently conducts heat from the heat generating portion to the at least one inner bond pad 40.

A ball bond 42 is formed on the at least one inner bond pads 40. A third type bonding wire 64 is drawn from one of the at least one the inner bond pad 40 upward and aside with a curvature. The curvature of the third type bonding wire 64 is controlled such that the height of the highest portion of the third type bonding wire 64 is greater than a vertical separation distance between the at least one inner bond pad 40 and a bottom surface of an upper package housing 90 in a state after formation of a hermetic seal upon sealing of a chip package comprising the lower package housing 80 and the upper package housing 90. Thus, once the chip package is formed, the third type bonding wire elastically contacts the bottom surface of the upper package housing 90. The angle, curvature, and the height of the third type bonding wire 64 is controlled such that force applied by the upper package housing 90 as the third type bonding wire is elastically deformed as the upper package housing 90 is brought to contact with the lower package housing 80 does not break the wire bonding at the ball bond 42 or the third type bonding wire 64.

After formation of the third type bonding wire 64 and at least another bonding wire 30 between the at least one outer bond pad 20 and at least one package side bond pad 70, an upper package housing 90 is attached to the lower package housing 80 to encapsulate the semiconductor chip 10 as in the first embodiment. The composition and diameter of the third type bonding wire 64 may be the same as the composition and diameter of the first type bonding wire 44 in the first embodiment. Not necessarily but preferably, the composition and diameter of the third type bonding wire 64 is the same as the composition of at least another bonding wire 30.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
a semiconductor chip;
at least one outer bond pad located in a peripheral region of a top surface of said semiconductor chip;
an inner bond pad located on said top surface inside said peripheral region of said semiconductor chip;
a bonding wire having a first end that extends from said inner bond pad and a second end that does not contact any surface; and
an assembly of a lower package housing and an upper package housing that encloses said semiconductor chip, said at least one outer bond pad, said inner bond pad, and said bonding wire.

2. The semiconductor structure of claim 1, further comprising:
at least another inner bond pad located on said top surface inside said peripheral region of said semiconductor chip; and
at least two programmable nodes that alter functionality of said semiconductor chip by presence or absence of an electrical contact between one of said at least two programmable nodes to another of said at least two programmable nodes and located in said semiconductor chip; wherein said at least another inner bond pad includes at least two inner bond pads, wherein each of said at least two programmable nodes is connected to said at least two inner bond pads, and wherein said at least one bonding wire connects two of said at least two inner bond pads.

3. The semiconductor structure of claim 2, further comprising:
a chip package containing at least one package side bond pad; and
at least another bonding wire connecting one of said at least one outer bond pad and one of said at least one package side bond pad.

4. The semiconductor structure of claim 2, wherein said at least two inner bond pads and said at least one outer bond pad comprise the same material and are located on a top surface of said semiconductor chip.

5. The semiconductor structure of claim 4, further comprising ball bonds located directly on said at least two inner bond pads and directly adjoined to said at least one bonding wire, wherein said bonding wire is a gold wire having a diameter from about 15 microns to about 500 microns.

6. The semiconductor structure of claim 1, wherein said at least one inner bond pad includes at least two inner bond pads, and wherein said at least one bonding wire connects two of said at least two inner bond pads.

7. The semiconductor structure of claim 6, further comprising at least one of a power supply network and a ground network located in said semiconductor chip, wherein said at least one bonding wire provides an electrical connection between two nodes of said power supply network or between two nodes of said ground network.

8. The semiconductor structure of claim 6, wherein said at least one bonding wire is a passive component that passively alters operation of at least one semiconductor device in said semiconductor chip.

9. The semiconductor structure of claim 6, wherein said passive component is one of an antenna, an inductor, and a coil.

10. The semiconductor structure of claim 1, wherein said at least one bonding wire is a passive component that passively alters operation of at least one semiconductor device in said semiconductor chip.

11. The semiconductor structure of claim 1, further comprising a chip package that encapsulates said semiconductor chip, wherein said at least one bonding wire contacts an inner surface of said chip package and transfers heat from said semiconductor chip said chip package.

12. A method of forming a semiconductor structure comprising:
forming at least one outer bond pad in a peripheral region of a top surface of a semiconductor chip and at least one inner bond pad on said top surface inside said peripheral region;

drawing at least one bonding wire from said at least one outer bond pad;

drawing another bonding wire from one of said at least one inner bond pad, wherein an end of said another bonding wire does not contact any surface; and enclosing said semiconductor chip within an assembly of a lower package housing and an upper package housing without bonding said end of said another bonding wire to any surface.

13. The method of claim 12, further comprising forming a ball bond on each of said at least one outer bond pad, wherein said ball bond directly contacts said at least one outer bond pad and said at least one bonding wire.

14. The method of claim 12, wherein said at least one outer bond pad and said at least one inner bond pad comprise gold and said at least one bonding wire comprises about 99% of gold and about 1% of silicon.

15. The method of claim 12, wherein said at least one inner bond pad comprises at least two inner bond pads, and wherein said method further comprises:

forming at least two programmable nodes that alter functionality of said semiconductor chip by presence or absence of an electrical contact between one of said at least two programmable nodes to another of said at least two programmable nodes in said semiconductor chip, wherein each of said at least two programmable nodes is connected to said at least two inner bond pads; and connecting one of at least two inner bond pads to another of at least two inner bond pads via said at least one bonding wire.

16. The method of claim 12, wherein said at least one inner bond pad comprises at least two inner bond pads, and wherein said method further comprises:

forming at least one of a power supply network and a ground network in said semiconductor chip;

connecting one of at least two inner bond pads to another of at least two inner bond pads via said at least one bonding wire, wherein said at least one bonding wire provides an electrical connection between two nodes of said power supply network or between two nodes of said ground network.

17. The method of claim 12, wherein said at least one bonding wire is a passive component that passively alters operation of at least one semiconductor device in said semiconductor chip.

18. The method of claim 12, further comprising forming a chip package encapsulating said semiconductor chip, wherein said at least one bonding wire contacts an inner surface of said chip package and transfers heat from said semiconductor chip said chip package.

19. The method of claim 12, further comprising:

attaching said semiconductor chip to a chip package containing at least one package side bond pad; and forming at least another bonding wire connecting one of said at least one outer bond pad and one of said at least one package side bond pad.

20. A semiconductor structure comprising:

a semiconductor chip;

at least one outer bond pad located in a peripheral region of a top surface of said semiconductor chip;

an inner bond pad located on said top surface inside said peripheral region of said semiconductor chip;

a bonding wire having a first end that contacts said inner bond pad and a portion that directly contacts a bottom surface of said upper package housing; and an assembly of a lower package housing and an upper package housing that encloses said semiconductor chip, said at least one outer bond pad, said inner bond pad, and said bonding wire.

* * * * *